United States Patent [19]

Maeda et al.

[11] Patent Number: 5,387,546

[45] Date of Patent: Feb. 7, 1995

[54] METHOD FOR MANUFACTURING A SEMICONDUCTOR DEVICE

[75] Inventors: Kazuo Maeda; Noboru Tokumasu; Yuko Nishimoto, all of Tokyo, Japan

[73] Assignees: Canon Sales Co., Inc.; Alcan-Tech Co., Ltd.; Semiconductor Process Laboratory Co., Ltd., all of Japan

[21] Appl. No.: 902,095

[22] Filed: Jun. 22, 1992

[51] Int. Cl.$^6$ .......................................... H01L 21/306
[52] U.S. Cl. ...................... 437/174; 437/235;
437/942; 437/943; 427/582 X; 427/583;
427/584; 148/DIG. 3; 148/DIG. 4; 148/DIG. 90; 148/DIG. 93
[58] Field of Search ............... 437/174, 235, 942, 943;
148/DIG. 3, DIG. 4, DIG. 90, DIG. 93;
427/582, 583, 584

[56] References Cited

U.S. PATENT DOCUMENTS

| | | | |
|---|---|---|---|
| 4,588,610 | 5/1986 | Yamazaki | 427/583 |
| 4,595,601 | 6/1986 | Horioka et al. | 427/583 |
| 4,702,936 | 10/1987 | Maeda et al. | 427/583 |
| 4,842,891 | 6/1989 | Miyazaki et al. | 427/584 |
| 5,171,710 | 12/1992 | Yamazaki et al. | 148/DIG. 3 |

FOREIGN PATENT DOCUMENTS

| | | |
|---|---|---|
| 0272141 | 6/1988 | European Pat. Off. . |
| 0435568 | 7/1991 | European Pat. Off. . |
| 0436185 | 7/1991 | European Pat. Off. . |
| 2543581 | 10/1984 | France . |

OTHER PUBLICATIONS

Patent Abstracts of Japan, vol. 015, No. 054 (E-1031) Feb. 8, 1991 & JP-A-22 83 022 (Hitachi Ltd.) Nov. 20, 1990.

Journal of the Electrochemical Society, vol. 138, No. 12, Dec. 1991, Manchester, New Hampshire US, pp. 3727–3732, K. Fujino et al. "Low Temperature and Atmospheric Pressure CVD Using Polysiloxane, OMCTS, and Ozone", p. 3727, Col. 1, para. 2.

Patent Abstracts of Japan, vol. 014, No. 362 (E-960) Aug. 6, 1990, & JP-A-21 28 460 (NEC Corp.) May 16, 1990.

Patent Abstracts of Japan, vol. 7, No. 200 (E-196) (1345) Sep. 3, 1983 & JP-A-58 98 933 (Suwa Seikosha K.K.) Jun. 13, 1983.

Primary Examiner—R. Bruce Breneman
Assistant Examiner—Ramamohan Rao Paladugu
Attorney, Agent, or Firm—Lorusso & Loud

[57] ABSTRACT

The present invention relates to a method for manufacturing a semiconductor device including a method for reforming an insulating film formed by a low temperature CVD method. It is an object of the present Invention to provide a method for manufacturing a semiconductor device capable of improving a film quality of an insulating film formed by a CVD method which is able to form a film at a low temperature and also capable of maintaining mass productivity, in which processing by irradiation with ultraviolet rays of the insulating film while heating the film after forming an insulating film (4) on a body to be formed by a chemical vapor deposition method is included.

19 Claims, 12 Drawing Sheets

F I G. 6
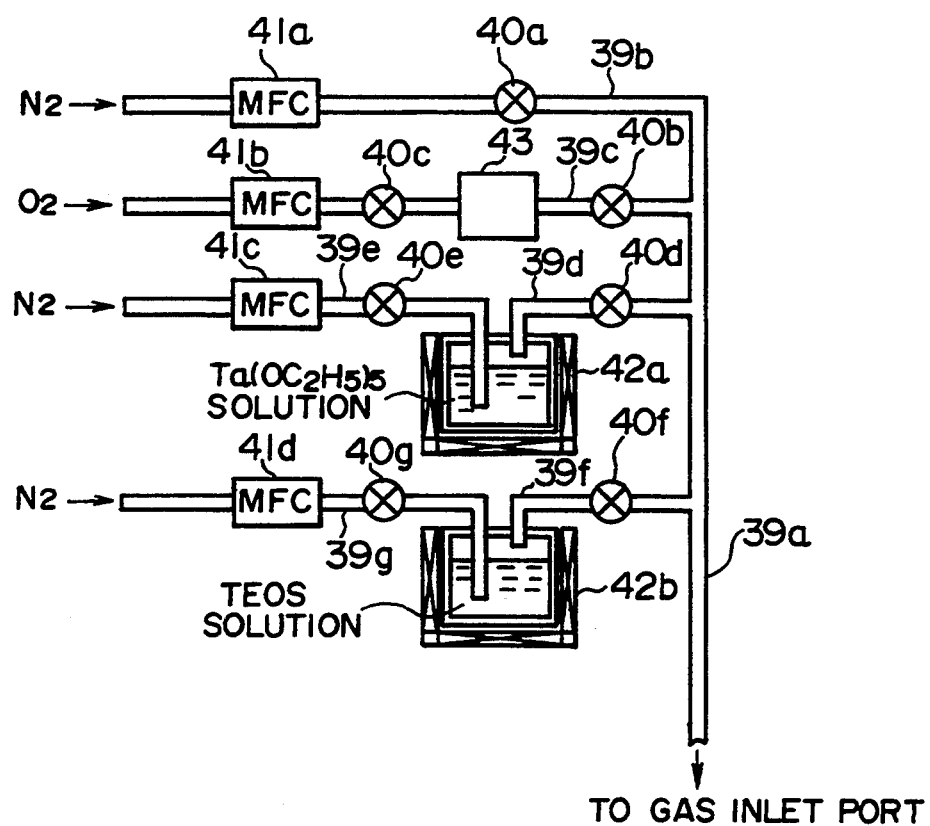

FIG. 10
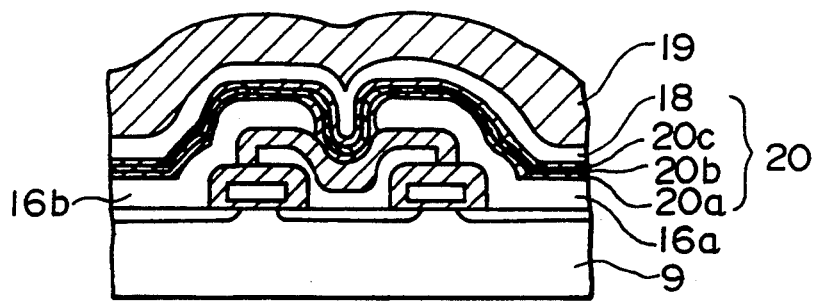
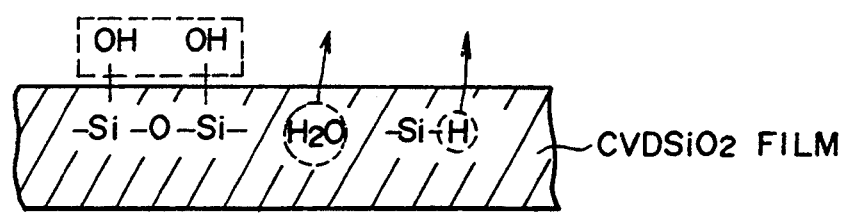
FIG. 11(a)
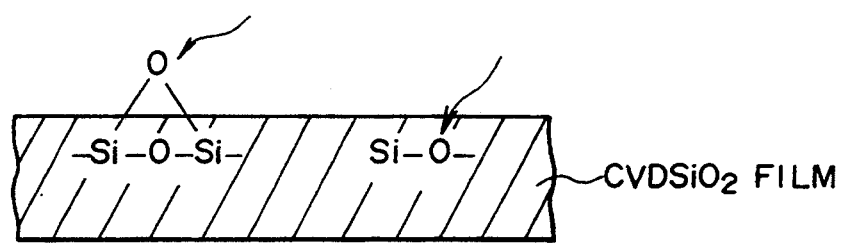
FIG. 11(b)

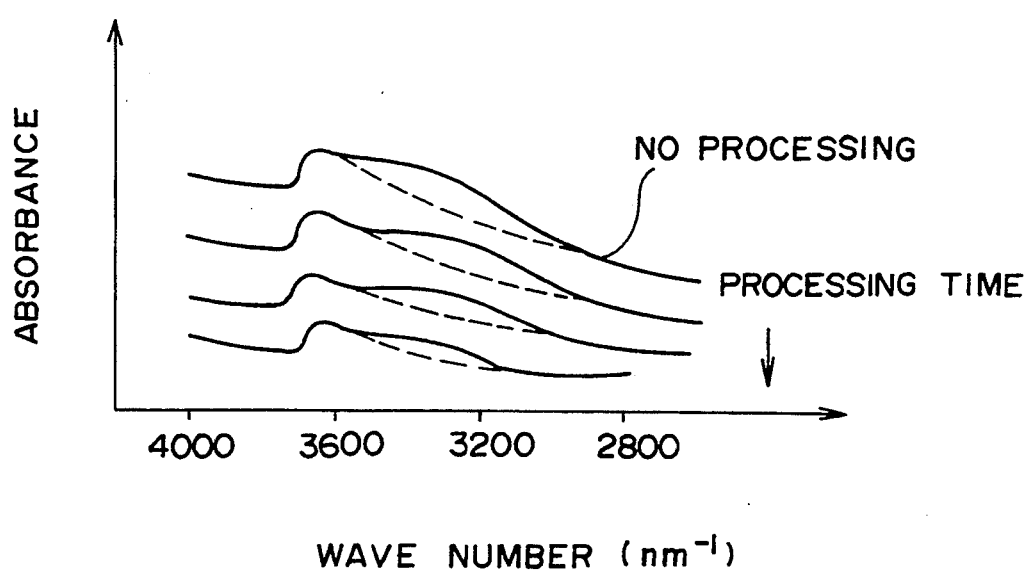
F I G. 12

METHOD FOR MANUFACTURING A SEMICONDUCTOR DEVICE

BACKGROUND OF THE INVENTION

1. Industrial Field of Utilization

The present invention relates to an apparatus for manufacturing a semiconductor and a method for manufacturing a semiconductor device, and more particularly to an apparatus for manufacturing a semiconductor and a method for manufacturing a semiconductor device including reforming an insulating film formed by low temperature CVD.

2. Prior Art

There are a variety of Chemical Vapor Deposition (CVD) methods for forming an insulating film, but a plasma CVD method and a thermal CVD method have been mainly used in recent years. In a very large scale integrated circuit (VLSI), among others a DRAM, an insulating film formed by a plasma CVD method is undesirable since it has inferior step coverage because of refinement and densification and because impurities such as carbon (C) and the like are contained in the formed insulating film. Thus, application of a thermal CVD method superior in step coverage, in particular a thermal CVD method capable of forming a film at a low temperature so as not to exert thermal influence upon other components is attracting attention for forming a refined and densified DRAM.

There have been two thermal CVD methods capable of forming a film at a low temperature as follows:

(1) reaction gas: mixed gas of mono-silane (SiH4)/oxygen ($O_2$), reaction temperature: 350° to 450° C.

(2) reaction gas: mixed gas of organic silane (TEOS)/ozone ($O_3$), reaction temperature: 350° to 450° C.

Further, as a CVD method superior in step coverage and capable of forming a film at a low temperature, an optical CVD method for forming a film while subjecting to ultraviolet rays is also attracting attention.

As a rule when a device becomes 1 μm or less, film quality of an interlevel insulating film and the like exerts a big influence upon the device characteristics, and the following problems have been associated with an interlevel insulating film formed by the low temperature CVD method.

Namely, problems affecting reliability by
(1) lowering of dielectric breakdown strength,
(2) increase of leakage current,
(3) corrosion of an Al film, etc. and the like are encountered. The reasons for such problems are that:
(1) the density of the formed insulating film is low,
(2) bonds such as moisture ($H_2O$) and Si—OH are contained in the formed insulating film, and
(3) bonds such as Si—H are sometimes contained.

In order to solve such problems, it is required:
(1) to form a film at the highest possible temperature,
(2) to form a film at the lowest possible growth speed,
(3) to increase $O_3$ concentration to the highest possible extent in a method using TEOS, and
(4) to anneal a film at the highest possible temperature after film formation.

However, these countermeasures have limits. For example, when an interlevel insulating film is formed by covering a Al film on a Si substrate, it is undesirable to increase the temperature to 450° C. or higher from the viewpoints of preventing deterioration of the contact between the Al film and the Si substrate and of preventing generation of hillocks and the like. Further, the growth speed cannot be greatly reduced because of need for mass productivity.

Furthermore, there is the problem in the optical CVD method that the growth rate and the film quality of the generated film are lowered because the generated film sticks to the radiating window through which ultraviolet rays are introduced into the chamber while forming a film, producing a blur thereon, and the effect of the ultraviolet rays is thereby reduced. Further, since the original growth rate is low in the optical CVD method, there is also the problem that this method is not suitable for mass production.

SUMMARY OF THE PRESENT INVENTION

It is an object of the present invention, which has been made in view of such conventional problems, to provide a method for manufacturing a semiconductor device capable of improving film quality of an insulating film formed by a CVD method at a low temperature, while maintaining mass productivity.

In a first aspect of the invention, the object is achieved by a method for manufacturing a semiconductor device, wherein, after forming an insulating film on a substrate by a chemical vapor deposition (CVD) method, the film quality of the insulating film is improved by application of ultraviolet wave energy to the insulating film.

In a second aspect, the object is achieved by a method for manufacturing a semiconductor device, wherein, by repeating the irradiation with ultraviolet rays of the insulating film a plurality of times after forming an insulating film on a substrate, the thickness of the film is increased gradually, thereby obtaining an insulating film having a predetermined film thickness with improved film quality.

In a third aspect, the object is achieved by a method for manufacturing a semiconductor device, wherein the ultraviolet ray processing is performed in an atmosphere containing at least one of ozone ($O_3$) gas, oxygen ($O_2$) gas and ammonia ($NH_3$) gas.

In a fourth aspect, the object is achieved by a method for manufacturing a semiconductor device, wherein the chemical vapor deposition is performed under atmospheric pressure.

In a fifth aspect, the object is achieved by a method for manufacturing a semiconductor device, wherein the chemical vapor deposition is performed under reduced pressure.

In a sixth aspect, the object is achieved by a method for manufacturing a semiconductor device, wherein the chemical vapor deposition is performed as follows:

reaction gas: mixed gas containing mono-silane (SiH4)/oxygen ($O_2$), and temperature: 350° to 450° C., and any one of a $SiO_2$ film, a PSG film, a BSG film and a BPSG film is formed as the insulating film.

In a seventh aspect, the object is achieved by a method for manufacturing a semiconductor device, wherein the chemical vapor deposition is performed as follows:

reaction gas: mixed gas containing organic silane (containing alkoxy compound of silicon, siloxane, alkyl-silane and the like)/ozone ($O_3$), and temperature: 350° to 450° C., and any one of a $SiO_2$ film, a PSG film, a BSG film and a BPSG film is formed as the insulating film.

In an eighth aspect, the object is achieved by a method for manufacturing a semiconductor device, wherein the chemical vapor deposition is performed as follows:

reaction gas: mixed gas containing organic compound such as tantalum (Ta)/ozone ($O_3$), temperature: 300° to 450° C., and a $Ta_2O_5$ film is formed as the insulating film.

In a ninth aspect, the object is achieved by an apparatus for manufacturing a semiconductor comprising a vapor deposition chamber in which a film is formed on a body to be formed by chemical vapor deposition, a ultraviolet rays processing chamber for applying ultraviolet ray to a film vapor-deposited on the body to be formed, and a gas inlet port for introducing processing gas into the ultraviolet ray emitting chamber.

In a tenth aspect, the object is achieved by a method for manufacturing a semiconductor device, wherein a plurality sets of processing systems including the vapor deposition chamber and the ultraviolet ray processing chamber as one set are connected so that the chemical vapor deposition and the ultraviolet ray processing may be performed alternately in consecutive order.

In an eleventh aspect, the object is achieved by a method for manufacturing a semiconductor, comprising moving means for moving a body continuously, said body passing the above-described plurality sets of processing systems so that it may be possible to perform the chemical vapor deposition and the ultraviolet ray processing alternately in consecutive order while moving the body continuously.

The method of the present invention will now be described with reference to the results of experiments made by the inventor of the present application.

A sample used in the experiments was produced as follows. Namely, a CVD $SiO_2$ which, in turn, is film having a film thickness of 2,000 Å is formed on a $SiO_2$ film formed by thermal oxidation on a Si substrate (wafer) under the following conditions:

(1) reaction gas: mixed gas ($O_3$ concentration: 1% in $O_2$) of organic silane (TEOS)/ozone ($O_3$), (2) wafer temperature: 400° C., and (3) forming speed: 1,000 A/min.

Then, after this wafer is heated with a heater and the wafer temperature is maintained at approximately 400° C., a mixed gas of oxygen gas/nitrogen gas, ozone gas or ammonia ($NH_3$) gas is introduced into a chamber 12 through a gas inlet port 13 and a mercury lamp is turned on, thus maintaining the state for a predetermined period of time.

Next, the following investigation was made for the CVD $SiO_2$ film thus processed. Explanation will be made of the case of a mixed gas of oxygen gas/nitrogen gas and the case of ammonia gas separately.

(1) In the case of a mixed gas of oxygen gas/nitrogen gas (a) Type of investigation (1) Investigation of the minuteness of a CVD $SiO_2$ film, i.e. etching rate, using an HF water solution, and (2) investigation of the composition of a CVD $SiO_2$ film by infrared absorption spectrum Besides, a similar investigation has also been made for a CVD $SiO_2$ film which is not irradiated with ultraviolet rays for purpose of comparison.

(b) Results of investigation

First, the result of investigation of the minuteness of a CVD $SiO_2$ film by etching rate, using an HF water solution, will be described. According to the result of investigation, the etching rate of the CVD $SiO_2$ film irradiated with ultraviolet rays becomes smaller as compared with the case of a CVD $SiO_2$ film which is not irradiated with ultraviolet rays and approaches the etching rate of a thermal oxidation film.

Next, the result of investigation of the composition of a CVD $SiO_2$ film by infrared absorption spectrum will be described. FIG. 12 shows the result of investigating the presence of $H_2O$ in a sample processed by irradiation with ultraviolet rays at a constant temperature of 400° C., in which variation of absorbance against the wave number ($nm^-$) is plotted against the emitting time as a parameter. Besides, the absorbance along the axis of ordinates is assigned optionally with respect to respective lines corresponding to respective parameters. According to the result of investigation, it has been found that the peak showing $H_2O$ becomes smaller as the processing time gets longer for the CVD $SiO_2$ film irradiated with ultraviolet rays.

The above-described two investigations show that $H_2O$ is eliminated by irradiation with ultraviolet rays, and the CVD $SiO_2$ film becomes more minute. Moreover, although not shown in FIG. 12, it is believed that groups such as Si—OH and Si—H are eliminated by irradiation with ultraviolet rays, which is deemed to contribute to densification of the CVD $SiO_2$ film.

Densification is attributed to removal of impurities such as —OH and —H bonded with $H_2O$ or Si from the surface and interior of the CVD $SiO_2$ film, which are discharged from the CVD $SiO_2$ film by the energy of the ultraviolet rays or by the combination of irradiation with ultraviolet rays and the elevated temperature as shown in FIG. 11(a). Furthermore, dangling Si bonds are contacted with oxygen atoms derived from oxygen gas activated by irradiation with ultraviolet rays as shown in FIG. 11(b) by using gas containing oxygen as the processing gas and irradiation with ultraviolet rays, to thereby further promote densification of the CVD $SiO_2$ film.

A mixed gas of oxygen gas/nitrogen gas is used in the experiment as processing gas, but similar results are also obtainable when ozone gas is used.

(2) In the case of ammonia gas:

(a) Type of investigation (1) Investigation of the moisture content in a CVD $SiO_2$ film by an electrochemical method, and (2) investigation of the composition of a CVD $SiO_2$ film by infrared absorption spectrum have been performed.

(b) Results of investigation

First, the result of investigation of the moisture content in a CVD $SiO_2$ film by an electrochemical method will be described. FIG. 13(a) shows the result of investigation of the moisture content in the CVD $SiO_2$ film by an electrochemical method, and shows variation of the moisture content (wt. %) in the CVD $SiO_2$ film against the time ultraviolet irradiation. A similar investigation was also made for a CVD $SiO_2$ film which was not irradiated with ultraviolet rays for the purpose of comparison.

According to the results of investigation, the moisture content in the CVD $SiO_2$ film irradiated with ultraviolet rays is reduced approximately half as compared with the case of a CVD $SiO_2$ film which is not irradiated with ultraviolet rays.

Next, the results of investigation of the composition of a CVD $SiO_2$ film by infrared absorption spectrum will be described. FIG. 13(b) shows the result of investigation of the H₂O with respect to a sample processed by irradiation with ultraviolet rays at a constant temperature of 400° C., in which variation of absorbance against the wave number (nm⁻) is plotted with the ultraviolet irradiating time as a parameter. Besides, the absorbance along the ordinate axis is optionally assigned lines corresponding to respective parameters.

According to the results of investigation, it has been found that the size of the peak showing H₂O becomes smaller rapidly and ceases to exist in processing for a short period of time (about several minutes) for a CVD $SiO_2$ film irradiated with ultraviolet rays in an ammonia gas atmosphere. Besides, in the case of processing in a mixed gas atmosphere of oxygen gas/nitrogen gas, the peak does not completely cease to exist until processing is performed for a substantially longer period of time. On the contrary, however, in the case of processing in an ammonia gas atmosphere, the peak ceases to exist completely in a short period of time.

The above-described two different results of investigation show that H₂O ceases to exist in a short period of time upon irradiation with ultraviolet rays in an ammonia gas atmosphere, thus making it possible to improve the minuteness of the CVD $SiO_2$ film. Besides, the bonds such as Si—OH and Si—H exist after film formation, but it is considered that such bonds have also ceased to exist due to irradiation with ultraviolet rays in an ammonia gas atmosphere, which contributes to improved densification of the CVD $SiO_2$ film.

As described above, it is possible to have bonds such as H₂O, Si—OH and Si—H eliminated by irradiation with ultraviolet rays applied to the manufacturing method of the present invention so as to increase the minuteness of the CVD $SiO_2$ film formed at a low temperature and improve the film quality. This is also applicable to a CVD $SiO_2$ film formed by using an atmosphere containing an alkoxy compound of silicon, siloxane, alkyl-silane or the like as an organic silane, a CVD $SiO_2$ film formed by using $SiH_4$-$O_2$ gas and a $Ta_2O_5$ film formed by using mixed gas of a tantalum organic compound and $O_3$.

In particular, by using gas containing oxygen, ozone gas or ammonia gas as processing gas, it is possible to further improve the minuteness of a CVD $SiO_2$ film and to further improve the film quality by the operation of these processing gases activated by irradiation with ultraviolet rays.

Furthermore, since a CVD $SiO_2$ film is formed independently, it is possible to maintain mass productivity, thus differing from an optical CVD method.

Moreover, a CVD $SiO_2$ film having a comparatively thin film thickness of approximately 2,000 Å is used, but a CVD $SiO_2$ film having a greater thickness may be used, and it is possible to form a CVD $SiO_2$ thick film with the film quality further improved by repeating vapor deposition/irradiation with ultraviolet rays.

Further, it is possible to continuously perform a series of processing steps for forming a CVD $SiO_2$ film having improved film quality, thus enabling automation by using an apparatus for manufacturing a semiconductor of the present invention in which the vapor deposition chamber and the ultraviolet processing chamber are connected.

Moreover, it is possible to perform a series of processing steps continuously and repeatedly because a plurality sets of processing systems including a vapor deposition chamber and an ultraviolet processing chamber as one set are connected with one another. With this, it is possible to form a CVD $SiO_2$ thick film with the film thickness further improved.

Besides, mass productivity is also improved by forming a film on a body while moving the body by a continuous transfer type moving means such as a belt conveyor.

BRIEF DESCRIPTION OF THE DRAWINGS

FIG. 6 is a schematic diagram explaining another reaction gas supply apparatus used in an embodiment of an apparatus for manufacturing a semiconductor of the present invention;

FIG. 10 is a sectional view explaining a ninth embodiment of a method for manufacturing a semiconductor device of the present invention with reference to an example applied to forming a capacitor insulating film of a DRAM;

FIGS. 11(a) and 11(b) are sectional views explaining a ninth embodiment of a method for manufacturing a semiconductor device of the present invention with reference to forming a capacitor insulating film of a DRAM;

FIG. 12 is a graph showing the infrared absorption spectrum of a CVD $SiO_2$ film processed with ultraviolet irradiation in a gas atmosphere containing oxygen according to a method for manufacturing a semiconductor device of the present invention.

DETAILED DESCRIPTION OF THE INVENTION

Embodiments of the present invention will be described hereinafter with reference to the drawings.

(1) Embodiments of an apparatus for manufacturing a semiconductor of the present invention.

(1) The first embodiment

Figure 1A:
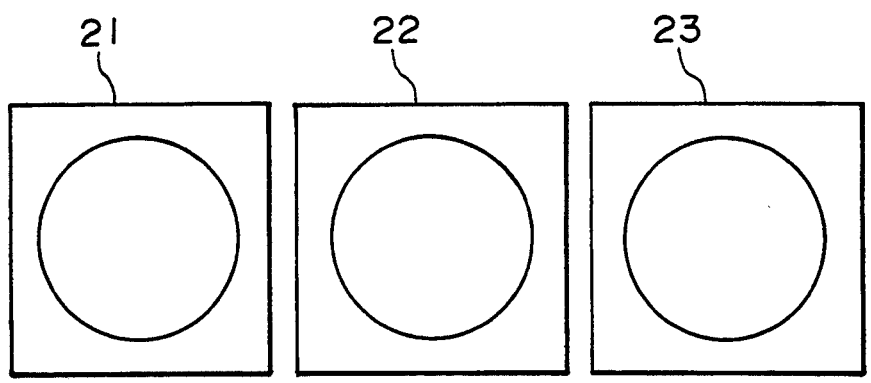
FIG. 1 is a schematic block diagram explaining a first embodiment of an apparatus for manufacturing a semiconductor of the present invention.
Figure 1B:
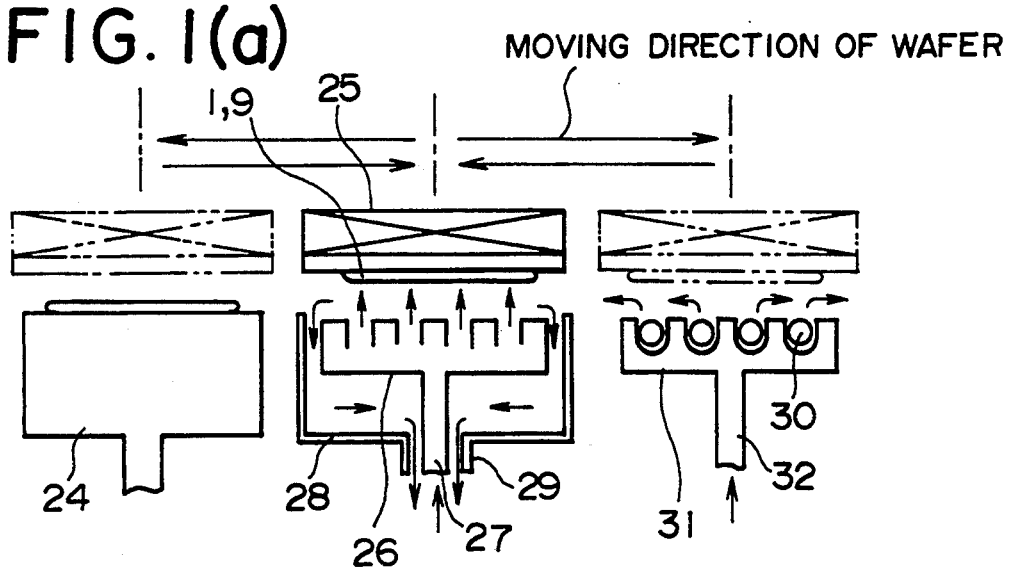

FIGS. 1(a) and (b) are schematic block diagrams of a first embodiment of an apparatus for manufacturing a semiconductor device of the present invention. FIG. 1(a) is a top view of an apparatus for manufacturing a semiconductor device of the present invention, and FIG. 1(b) is a side view thereof. Here, partition walls among respective chambers and valves for opening and closing respective chambers are omitted.

In FIGS. 1(a) and (b), a load/unload chamber 21, a CVD reaction chamber (a vapor deposition chamber) 22 and a UV processing chamber (an ultraviolet rays processing chamber) 23 are connected in this order, and a wafer 1 or 9 is moved to the load/unload chamber 21 by means of a robot 24 or the like. Thus, a series of processing steps including chemical vapor deposition (CVD) and ultraviolet processing can be performed successively. Reference numeral 24 in the figure represents a robot for conveying the wafer to the load/unload chamber 21, and the conveying robot 24 or a wafer holder 25 are moved up and down so that the wafer 1 or 9 may be delivered to the wafer holder 25 in the load/unload chamber 21. In this case, the wafer 1 or 9 is held by the wafer holder 25 by means of a vacuum chuck or an electrostatic chuck so that the film forming face thereof faces downward. In addition, the wafer holder 25 includes a heater for heating and thermal insulation formed integrally therewith.

Further, 26 represents a gas dispersing head provided in the CVD reaction chamber 22 for blowing reaction gas upward toward the film forming surface of the wafer 1 or 9. A reaction gas piping is connected at a reaction gas inlet port 27 of the gas dispersing head 26, and required mixed gas is supplied by means of a reaction gas supply source shown in FIG. 5 or FIG. 6. Then, the reaction gas introduced into the reaction gas inlet port 27 is emitted from the gas dispersing head 26, and the gas after reacting on the film forming face of the wafer 1 or 9 can be discharged from the CVD reaction chamber 22 through a gas exhaust port 29 of a gas gathering unit 28 which surrounds the periphery of the gas nozzle 26.

Furthermore, 30 represents a mercury lamp provided in the UV processing chamber 23 for emitting ultraviolet rays upward toward the film forming face of the wafer 1 or 9. Further, it is possible to introduce processing gas which contributes to improvement of the film quality through a processing gas inlet port 32 of a mercury lamp holder 31. Besides, a gas exhaust port (not shown) for discharging processing gas from the chamber is provided in the UV processing chamber.

As described above, according to the first embodiment of an apparatus for manufacturing a semiconductor of the present invention, it is possible to perform a series of processing steps for forming a film of good film quality including vapor deposition and irradiation with ultraviolet rays successively, and thus also making automation possible since the CVD reaction chamber 22 and the UV processing chamber 23 are connected with each other.

Further, since the UV processing chamber 23 is provided with the processing gas inlet port 32, it is possible to perform ultraviolet irradiation in a processing gas atmosphere which contributes to improvement of the film quality. With this, it becomes possible to form a film of still better film quality.

Furthermore, it is possible to form a CVD film under either atmospheric pressure or reduced pressure by providing switching means among respective chambers 21, 22 and 23, thereby to control the pressure in the CVD reaction chamber 22 independently. Further, it becomes possible, by making a round trip a plurality of times between the CVD reaction chamber 22 and the UV processing chamber 23, to form a film having a film thickness corresponding to the number the round trips.

Next, the reaction gas supply source for supplying reaction gas to the gas dispersing head 26 will be described with reference to FIG. 5 and FIG. 6.

(A) Supply source of mixed gas containing organic silane (TEOS)/ozone ($O_3$)

Figure 5:
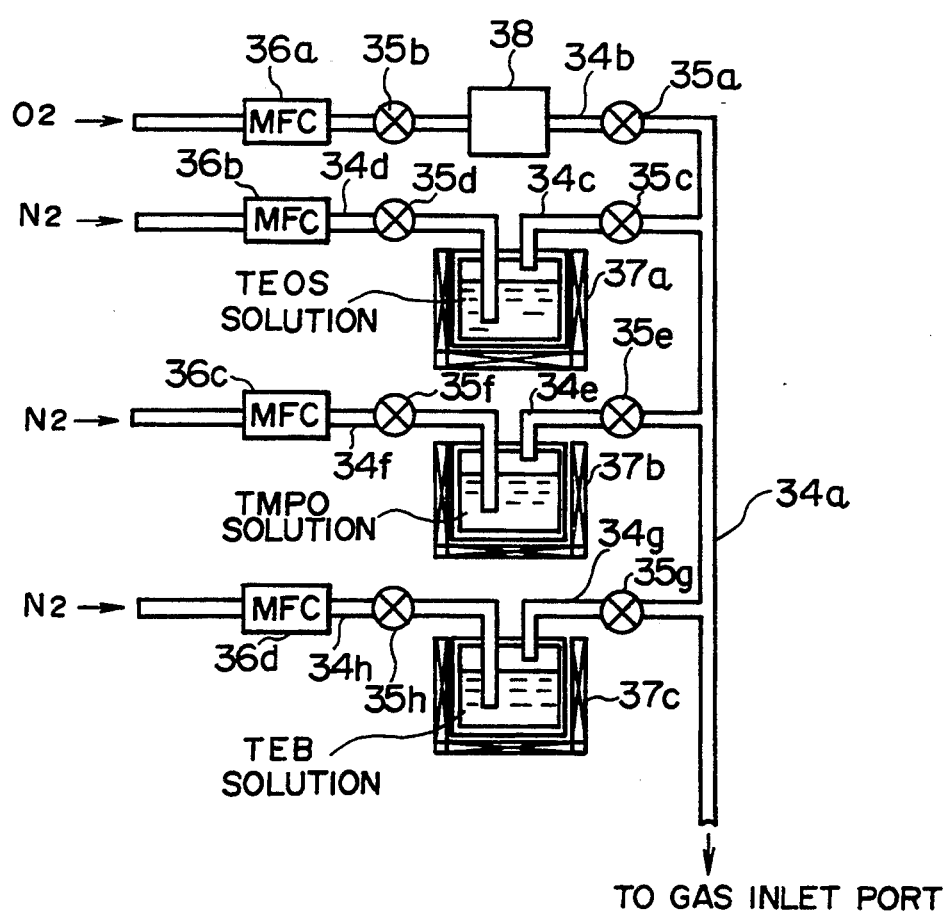
FIG. 5 is a schematic diagram explaining a reaction gas supply apparatus used in an embodiment of an apparatus for manufacturing a semiconductor of the present invention.

FIG. 5 is a schematic diagram of an apparatus for supplying mixed gas containing TEOS/ozone.

In FIG. 5, 34a represents a gas piping connected to the reaction gas inlet port 27 of the gas dispersing head 26 for feeding the reaction gas to the gas dispersing head 26, and gas pipings 34b, 34c, 34e and 34g for introducing ozone gas, nitrogen gas containing a TEOS solution and other gases are connected thereto. 34b represents a gas piping for oxygen gas and ozone gas generated by an ozonizer, 34c represents a gas piping for nitrogen gas containing a TEOS solution, 34e represents a gas piping for nitrogen gas containing TMPO or TMOP (Trimethylphosphate: $PO(OCH_3)_3$: referred to hereinafter as TMPO), and 34g represents a gas piping for nitrogen gas containing a TEB (Triethylborate) solution. Valves 35a to 35c, 35e and 35g for controlling conduction/suspension are provided in respective gas pipings 34b, 34c, 34e and 34g. Further, 34d, 34f and 34h represent gas pipings for feeding nitrogen gas to the TEOS solution, the TMPO solution and the TEB solution, respectively, and valves 35d, 35f and 35h for controlling conduction/suspension are provided in respective gas pipings 34d, 34f and 34h.

Furthermore, 38 represents an ozonizer connected to the gas piping 34b, 37a to 37c represent heaters for heating and thermally insulating the TEOS solution, the TMPO solution and the TEB solution, respectively, and 36a to 36d represent mass flow controllers for controlling the flow rates of oxygen gas and nitrogen gas as carrier gas.

As described above, it is possible to form a $SiO_2$ film, a PSG film, a BSG film, a BPSG film or the like by connecting the above-described reaction gas supply source to the gas dispersing head. While TEOS is used as the organic silane, alkoxy compounds of silicon, siloxane, alkylsilane and the like may also be used.

(B) Supply source of mixed gas of a tantalum organic compound and ozone

FIG. 6 is a schematic diagram showing an apparatus for feeding mixed gas containing a tantalum organic compound and ozone.

In FIG. 6, 39a represents a gas piping connected to the reaction gas inlet port 27 of the gas nozzle 26 shown in FIG. 1(b), for instance for feeding reaction gas to the gas nozzle 26, 39b represents a gas piping for leading nitrogen gas as carrier gas to the gas piping 39a, 39c represents a gas piping for feeding oxygen gas to an ozonizer 43 and leading ozone gas produced by the ozonizer 43 to the gas piping 39a, 39e represents a gas piping for feeding nitrogen gas through a pentaethoxytantalum ($Ta(OC_2H_5)_5$) solution, 39d represents a gas piping for leading nitrogen gas containing $Ta(OC_2H_5)_5$ gas to the gas piping 39a, 39g represents a gas piping for feeding nitrogen gas to the TEOS solution, and 39f represents a gas piping for leading nitrogen gas containing the TEOS solution to the gas piping 39a.

Furthermore, 40a represents a valve provided in the gas piping 39b for controlling conduction/suspension of the gas, 40b and 40c represent valves provided before and behind the ozonizer 43 for controlling conduction/suspension, 40d to 40g represent valves provided in gas pipings 39d to 39g, respectively, and 41a to 41d represent mass flow controllers for controlling the flow rates of nitrogen gas and oxygen gas flowing in the pipings 39b, 39c, 39e and 39g, respectively. Further, 42a and 42b represent heaters with thermostats for heating the Ta-(OC$_2$H$_5$)$_5$ solution and the TEOS solution at a constant temperature.

As described above, it is possible to form a triple layer insulating film of Ta$_2$O$_5$ or SiO$_2$/Ta$_2$O$_5$/SiO$_2$ and the like by connecting the reaction gas supply source to the gas dispersing head.

(2) The second embodiment

Figure 2:
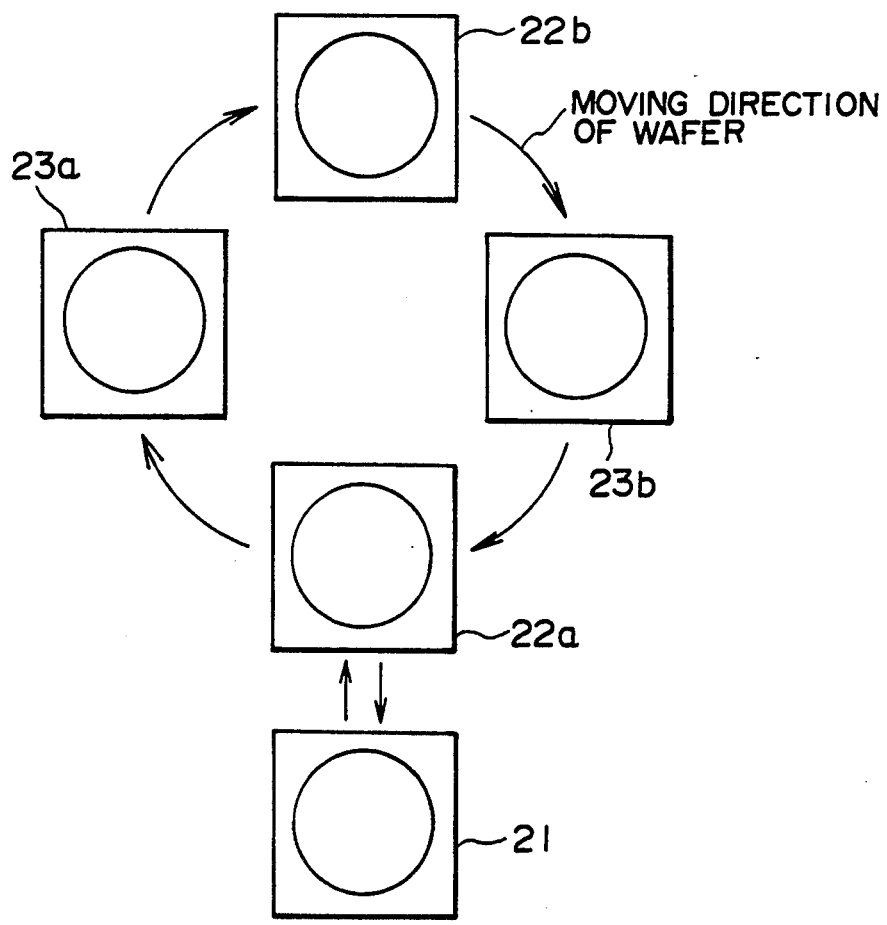
FIG. 2 is a schematic block diagram explaining a second embodiment of an apparatus for manufacturing a semiconductor of the present invention.

FIG. 2 is a block diagram explaining a second embodiment of an apparatus for manufacturing a semiconductor of the present invention. What differs from the structure shown in FIG. 1 is that a series of processing steps can be performed successively and repeatedly by connecting a plurality sets of processing systems (22a, 23a) and (22b, 23b) each having a CVD reaction chamber (a vapor deposition chamber) and a UV processing chamber (an ultraviolet rays processing chamber) as one set are connected with one another.

In FIG. 2, 21 represents a load/unload chamber connected to the CVD reaction chamber 22a, and a switching means is provided between the CVD reaction chamber 22a and the load/unload chamber 21 connected thereto when occasion demands. Further, (22a, 23a) and (22b, 23b) represent processing systems including the CVD reaction chamber and the UV processing chamber as one set, and a series of processing steps can be performed successively and repeatedly by connecting a plurality sets of processing systems (22a, 23a) and (22b, 23b). Besides, a switching means is also provided between the CVD reaction chambers 22a and 22b and the UV processing chambers 23a and 23b as needed.

Furthermore, a gas nozzle such as described with reference to FIG. 1 is provided for each of respective CVD reaction chambers 22a and 22b, where reaction gas is supplied from a reaction gas supply source shown in FIG. 5 or FIG. 6. Further, a mercury lamp such as described with reference to FIG. 1 is provided in respective UV processing chambers 23a and 23b. Moreover, it is possible to provide a processing gas inlet port in respective UV processing chambers 23a and 23b in a manner similar to the first embodiment.

As described above, according to the second embodiment of an apparatus for manufacturing a semiconductor of the present invention, it is possible to perform a series of processing steps successively and repeatedly since a plurality sets of processing systems (22a, 23a) and (22b, 23b) including the CVD reaction chamber and the UV processing chamber as one set are connected to one another.

Furthermore, since it is possible to perform processing by irradiation with ultraviolet rays in a processing gas atmosphere which contributes to improvement of the film quality in a manner similar to the first embodiment by providing a processing gas inlet port in respective UV processing chambers 23a and 23b, it becomes possible to form a film of still better film quality. Further, similarly to the first embodiment, it is possible to form a CVD film under atmospheric pressure or reduced pressure by providing switching means among respective chambers 21, 22a, 23a, 22b and 23b so as to control the pressure in respective chambers 22a and 22b.

(3) The third embodiment

Figure 3:
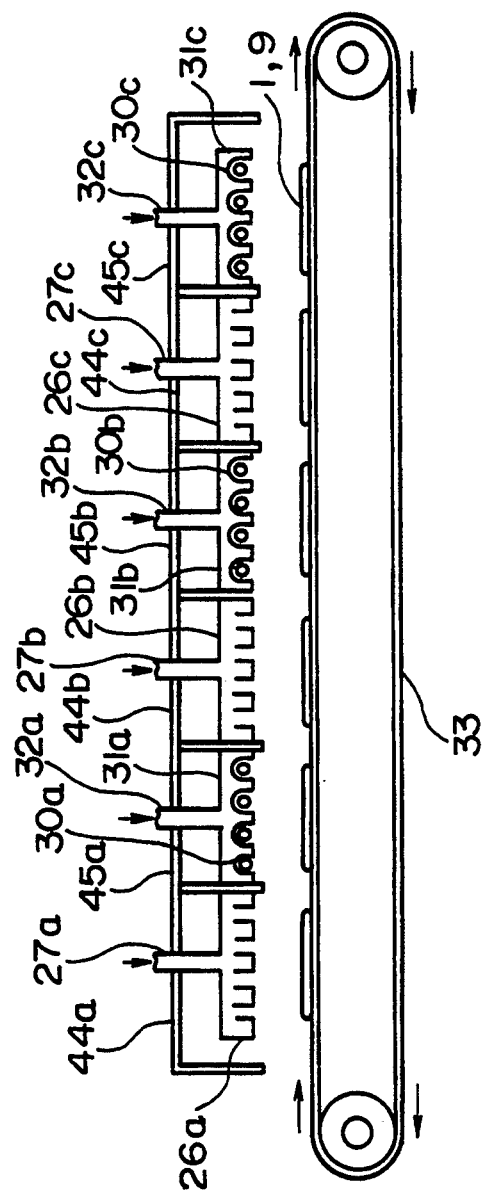
FIG. 3 is a schematic diagram explaining a third embodiment of an apparatus for manufacturing a semiconductor of the present invention.

FIG. 3 is a schematic diagram explaining a third embodiment of an apparatus for manufacturing a semiconductor of the present invention. What differs from the structure shown in FIG. 2 is that a plurality sets of processing systems including a CVD reaction zone (corresponding to the CVD reaction chamber) and a UV processing zone (corresponding to the UV processing chamber) as one set are connected to one another, and it is made possible to perform a series of processing steps successively and repeatedly while moving the wafer by means of a belt conveyor (continuously moving type transfer means) 33.

In FIG. 3, (44a, 45a), (44b, 45b) and (44c, 45c) represent processing systems, including a CVD reaction zone and a UV processing as one set, in which respective processing systems are arranged in one line with three systems arranged horizontally. Thus, it is made possible to perform a series of vapor deposition and ultraviolet processing steps successively and repeatedly by having the wafer 1 or 9 pass through respective processing systems (44a, 45a), (44b, 45b) and (44c, 45c) by moving the belt conveyor 33, on which the wafer 1 or 9 is placed, at an appropriate speed. Besides, an exhaust port for reaction gas and the like (not shown) is provided in each of the respective zones so that reaction gas and the like introduced into respective zones do not break into other zones.

Further, 26a to 26c represent gas dispersing heads provided in CVD reaction zones 44a, 44b and 44c, respectively, and gas pipings 34a and 39a of the reaction gas supply source shown in FIG. 5 or FIG. 6 are connected to reaction gas inlet ports 27a to 27c of respective gas dispersing heads 26a to 26c. Thus, the reaction gas is supplied onto the wafer 1 or 9. With this, an insulating film is formed on the wafer 1 or 9. Further, 30a to 30c represent mercury lamps provided in the UV processing zones 45a, 45b and 45c, and the insulating film and the like formed on the wafer 1 or 9 are processed by irradiation with ultraviolet rays. At this time, it is possible to introduce processing gas through processing gas inlet ports 32a to 32c of mercury lamp holders 31a to 31c and onto the wafer 1 or 9.

As described above, according to the third embodiment of an apparatus for manufacturing a semiconductor of the present invention, since a continuously moving type transfer means such as a belt conveyor 33 is provided, it is possible to form an insulating film and the like of excellent film quality on the wafer 1 or 9 while moving the wafer 1 or 9. With this, mass productivity is also improved.

(4) The fourth embodiment

Figure 4:
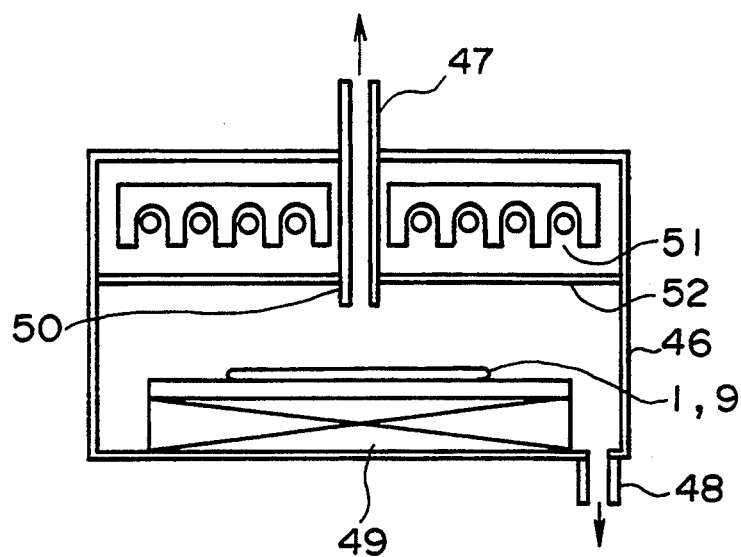
FIG. 4 is a schematic diagram explaining a fourth embodiment of an apparatus for manufacturing a semiconductor of the present invention.

FIG. 4 is a schematic diagram explaining a fourth embodiment of an apparatus for manufacturing a semiconductor of the present invention. What differs from the first through the third embodiments is that mercury lamps 51 are provided in a chamber 46 of an atmospheric pressure CVD apparatus, so that film formation and processing by irradiation with ultraviolet rays may be performed in the same chamber 46.

Reference numeral 47 in the figure represents an inlet port for introducing a reaction gas into the chamber 46, and it is possible to change over the connection between the reaction gas inlet port 47 and the piping of reaction gas for forming the CVD film to the connection between the reaction gas inlet port 47 and the piping of the processing gas for processing by ultraviolet irradiation in the processing gas atmosphere. 48 represents a gas exhaust port for discharging reacted gas, 49 represents a wafer placement table formed integrally with a heater, 50 represents a gas dispersing head for blowing reaction gas introduced through the reaction gas inlet port 47 onto the wafer 1 or 9, and 52 represents a quartz window for isolating mercury lamps 51 from the reaction gas.

It is possible to easily form a CVD insulating film and the like with improved film quality by the fourth embodiment also.

(2) Embodiments of a method for manufacturing a semiconductor device of the present invention Next, embodiments of a method for manufacturing a semiconductor device of the present invention will be described with reference to the above-described apparatus for manufacturing a semiconductor.

(5) The fifth embodiment

FIGS. 7(a) to (d) are sectional views explaining a method for forming an inter level insulating film in a fifth embodiment of the present invention. A case in which an apparatus for manufacturing a semiconductor of the first embodiment shown in FIGS. 1(a) and (b) where the reaction gas supply source shown in FIG. 5 is connected to the gas dispersing head in the CVD reaction chamber will be described hereinafter. Ozone or oxygen is used as the processing gas in processing by irradiation with ultraviolet rays.

Figure 7A:
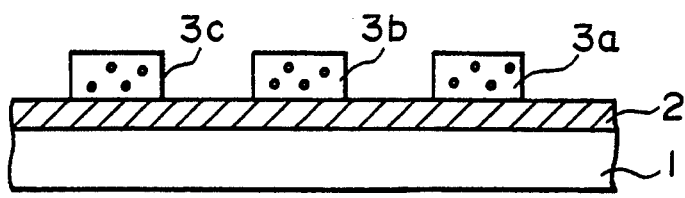
FIGS. 7(a), 7(b), 7(c) and 7(d) are sectional views explaining fifth and sixth embodiments of a method for manufacturing a semiconductor device of the present invention.

First, as shown in FIG. 7(a), Al interconnections 3a to 3c are formed on a $SiO_2$ film 2 after forming the $SiO_2$ film 2 on a Si substrate (wafer) 1 by thermal oxidation.

Then, the wafer 1 is conveyed into the load/unload chamber 21 shown in FIG. 1(a) by means of the robot 24 shown in FIG. 1(b) and moved to under the wafer holder 25. Thereafter, the robot 24 is moved upward, and the wafer 1 is held by the wafer holder 25 by means of an electrostatic chuck so that the film forming face of the wafer 1 faces downward.

Next, the wafer holder 25 is moved to the CVD reaction chamber 22.

Then, the wafer 1 is heated by a heater formed integrally with the wafer holder 25 so as to hold it at a temperature of approximately 400° C., and oxygen gas is fed to the ozonizer 38 by opening valves 35a and 35b of the reaction gas supply source shown in FIG. 5 at the same time. The oxygen gas is led to the gas piping 34a so that the ozone gas concentration in oxygen gas reaches approximately 1% under control of the mass flow controller 36a. Further, the valves 35c and 35d are opened then at the same time, and nitrogen gas containing a TEOS solution at a predetermined flow rate is led to the gas piping 34a under control of the mass flow controller 36a. As a result, the mixed gas of TEOS/ozone led to the gas piping 34a passes through the inlet port 27 and onto the wafer 1 by means of the gas dispersing head 26. Such a state is held for a predetermined period of time, and a CVD $SiO_2$ film 4 having a film thickness of approximately 8,000 Å is formed covering the Al interconnections 3a to 3c on the wafer 1 (FIG. 7(b)). Since the CVD $SiO_2$ film 4 is formed at a low temperature at this time, impurities and the like such as —OH and —H usually bonded with $H_2O$ and Si are contained on the surface and the inside of the CVD $SiO_2$ film 4.

Next, after suspending the supply of reaction gas, the wafer holder 25 shown in FIG. 1(b) is moved to the UV processing chamber 23 shown in FIG. 1(a). Then, mercury lamps 30 are turned on, and ozone gas or oxygen gas is introduced through a processing gas inlet port 32 of a mercury lamp holder 31, thereby contacting the surface of the wafer 1 with ozone gas or oxygen gas. Then, this state is held for a predetermined period of time.

At this time, as shown in FIG. 11(a), impurities such as —OH and —H bonded with $H_2O$ and Si on the surface of the CVD $SiO_2$ film 4 and inside the CVD $SiO_2$ film 4 are discharged from the CVD $SiO_2$ film 4 by the energy of the ultraviolet rays and interaction between ultraviolet irradiation and heating. Further, since the wafer surface is contacted with ozone gas or oxygen gas, the dangling bond of Si is inundated with oxygen atoms by the interaction of oxygen activated by ozone or irradiation with ultraviolet rays and the CVD $SiO_2$ film 4a is further densified as shown in FIG. 11(b) when irradiated with ultraviolet rays. The reformation of the CVD $SiO_2$ film 4a formed at a low temperature is completed in this manner (FIGS. 7(c) and (d)).

Thereafter, the mercury lamps 30 are turned off, and the wafer holder 25 is moved through the CVD reaction chamber 22 and sent to the load/unload chamber 21. Further, the wafer 1 is delivered to the robot 24 by an operation reverse to that when the wafer 1 is carried in, and the wafer 1 is taken out of the apparatus by means of the robot 24.

As described above, according to the method for forming an inter level insulating film in the fifth embodiment of the present invention, it is possible to prevent hillocks and the like of the Al interconnection from being generated since the CVD $SiO_2$ film 4 is formed at a low temperature. Further, since processing by irradiation with ultraviolet rays is performed, it is possible to have $H_2O$ and bonds such as Si—OH and Si—H cease removed from the CVD $SiO_2$ film 4, to form a minute CVD $SiO_2$ film 4 at a low temperature as shown in FIG. 12. With this, it is also possible to prevent migration of $H_2O$ from the exterior, thus obtaining a film of good quality containing no moisture and the like. Furthermore, since irradiation with ultraviolet rays is performed in the atmosphere of ozone gas or oxygen gas, the dangling bond of Si is inundated with oxygen atoms by the operation of oxygen activated by ozone or irradiation with ultraviolet rays as shown in FIG. 11(b). Thus, the CVD $SiO_2$ film 4a is further densified.

Accordingly, it is possible to prevent lowering of the dielectric breakdown strength of the CVD $SiO_2$ film 4 itself, to prevent increase of leakage current between an upper Al interconnection formed later on the CVD $SiO_2$ film 4a and a lower Al interconnection, and lowering of reliability due to corrosion of the A interconnection and the like. Further, since the CVD $SiO_2$ film 4a can be formed independently, mass productivity can be secured, in contrast to an optical CVD method.

As described above, in the fifth embodiment, a CVD $SiO_2$ film 4a is formed, but a PSG film, a BSG film, a BPSG film and the like can also be formed by mixing a TMPO solution or a TEP solution with reaction gas, and the present invention is also applicable to these films. Further, while TEOS is used above as the organic silane, the present invention may also use an alkoxy compound of silicon, siloxane, alkyl-silane and the like. Furthermore, ozone gas or oxygen gas is used as processing gas, but ammonia gas may also be used. Further, the wafer temperature is set at 400° C. in processing by irradiation with ultraviolet rays, but the processing can be performed within the temperature range of from 200° to 400° C.

(6) The sixth embodiment

Next, a case when the apparatus for manufacturing a semiconductor in the first embodiment shown in FIGS. 1(a) and (b) in which the reaction gas supply source shown in FIG. 5 is connected to the gas dispersing head of the CVD reaction chamber is used, and ammonia gas is used as processing gas in processing by irradiation with ultraviolet rays will be described with reference to FIGS. 7(a) to (d).

First, as shown in FIG. 7(a), Al interconnections 3a to 3d are formed on a $SiO_2$ film 2 after forming the $SiO_2$ film 2 on a Si substrate (wafer) by thermal oxidation in a manner similar to the first embodiment.

Figure 7B:
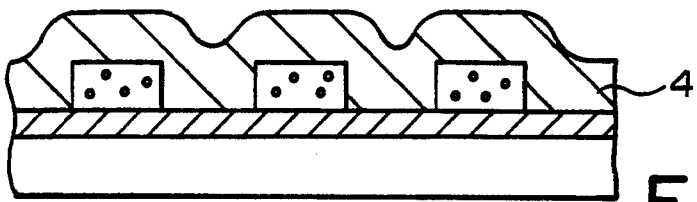
Figure 7C:
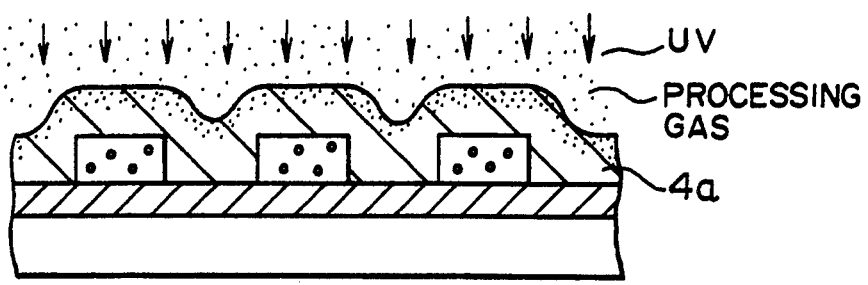
Figure 7D:
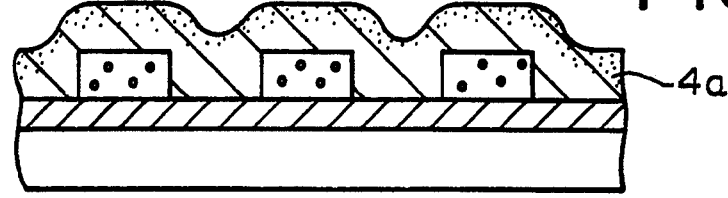

In succession, as shown in FIG. 7(b), a CVD $SiO_2$ film (insulating film) 4 having a film thickness of approximately 8,000 Å is formed on a body heated to a temperature of approximately 400° C. using the CVD apparatus shown in FIGS. 1(a) and (b) in a manner similar to the first embodiment.

Next, after suspending supply of reaction gas, the wafer holder 25 shown in FIG. 1(b) is moved to the UV processing chamber 23 shown in FIG. 1(a) while maintaining the wafer temperature at approximately 400° C. for the purpose of reforming the CVD $SiO_2$ film 4. Then, mercury lamps 30 are turned on and ammonia gas is introduced through the processing gas inlet port 32 of the mercury lamp holder 31 at the same time, thereby to contact the surface of the wafer 1 with ammonia gas. This state is held for a predetermined period of time. At this time, as shown in FIG. 11(a), impurities such as —OH and —H bonded with $H_2O$ or Si on the surface of the CVD $SiO_2$ film 4 and inside the CVD $SiO_2$ film 4 are discharged from the CVD $SiO_2$ film 4 by the energy of ultraviolet rays or interaction between irradiation with ultraviolet rays and heating, and the CVD $SiO_2$ film 4a is also further densified by the operation of ammonia gas activated by irradiation with ultraviolet rays. Thus, reforming of the CVD $SiO_2$ film 4a formed at a low temperature is completed (FIGS. 7(c) and (d)).

Thereafter, mercury lamps 30 are turned off, and the wafer holder is moved so as to pass through the CVD reaction chamber 22 and sent to the load/unload chamber 24. Furthermore, the wafer 1 is delivered to the robot 24 by operation reverse to that when the wafer 1 is carried in, and the wafer 1 is taken out of the apparatus by means of the robot 24.

Figure 13A:
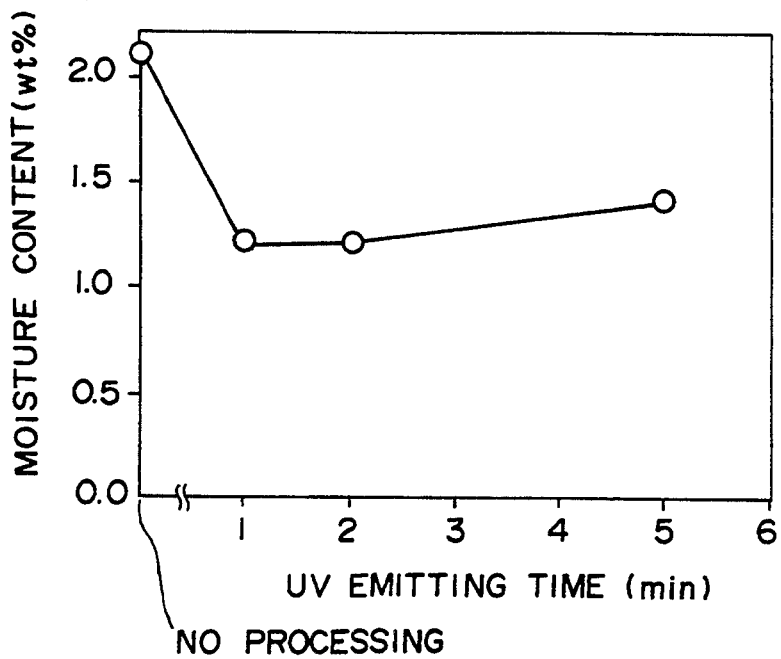
FIGS. 13A and 13B are graphs showing the moisture content and infrared absorption spectrum of a CVD $SiO_2$ film processed by ultraviolet irradiation in an ammonia gas atmosphere according to a method for manufacturing a semiconductor device of the present invention.
Figure 13B:
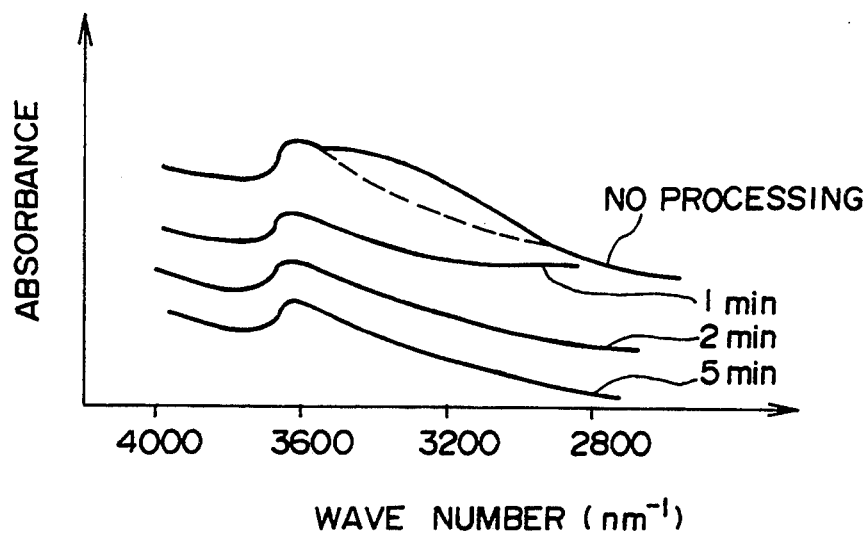

Investigation of (1) the moisture content in the film by an electrochemical method, and (2) the composition of the film by infrared absorption spectrum show that the moisture content is reduced about half as compared with a case where no processing is performed as shown in FIG. 13(a), and the peak showing $H_2O$ ceases to exist as shown in FIG. 13(b) by irradiation with ultraviolet rays.

Now, this CVD $SiO_2$ film 4a was left as it is in the atmosphere for one week, but no change was noticed in the moisture content in the CVD $SiO_2$ film 4. This fact shows that those factors that cause generation of moisture have been removed from the inside of the CVD $SiO_2$ film 4, that migration of new moisture from the outside of the CVD $SiO_2$ film 4a is prevented, and that the CVD $SiO_2$ film 4a is further densified. This is considered due to the reasons that $H_2O$ and the like are discharged from the CVD $SiO_2$ film 4a by ultraviolet rays of high energy or by the operation of activated ammonia gas, or that the other films have been reformed.

Incidentally, when the result of a case shown in FIG. 13(b) in which ammonia gas is used is compared with the result of a case shown in FIG. 12 in which oxygen gas is used, it is shown that the peak showing $H_2O$ becomes smaller gradually as the ultraviolet rays emitting time gets longer when processed with oxygen gas. However, the peak ceases to exist in a short period of time (several minutes) when processed with ammonia gas, the peak was only slightly noticed even with irradiation with ultraviolet rays for only several tens of minutes. As a result, it is recognized that the processing by irradiation with ultraviolet rays with ammonia has a bigger effect than the processing by irradiation with ultraviolet rays with oxygen.

As described above, according to the sixth embodiment of the present invention, it is possible to prevent hillocks and the like on the Al interconnections 3a to 3c from generating since the CVD $SiO_2$ film 4a is formed at a low temperature. Moreover, since processing by irradiation with ultraviolet rays is performed, $H_2O$ and bonds such as Si—OH and Si—H are removed from the CVD $SiO_2$ film 4 containing much of them at time of formation because of formation at a low temperature, and the CVD $SiO_2$ film 4a is densified.

Since it is possible to prevent lowering of dielectric breakdown strength of the CVD $SiO_2$ film 4a itself and to prevent moisture and the like from migrating from outside of the CVD $SiO_2$ film 4a, it is possible to prevent increase of leakage current between the upper Al interconnection formed later on the CVD $SiO_2$ film 4a and lower Al interconnections 3a to 3c and lowering of reliability by corrosion of Al interconnections 3a to 3c and the like.

The wafer temperature is set at 400° C. in processing by irradiation with ultraviolet rays in the sixth embodiment, but the processing is also possible within the temperature range from 200° to 400° C.

(7) The seventh embodiment

FIGS. 8(a) to (d) are sectional views explaining a method for forming an interlevel insulating film in the seventh embodiment of the present invention. An apparatus for manufacturing a semiconductor in the second embodiment shown in FIG. 2 in which the reaction gas supply source shown in FIG. 5 is connected to the gas dispersing head of the CVD reaction chamber will be described hereunder.

What differs from the fifth embodiment is that a predetermined film thickness of 8,000 Å is not formed at once, but the predetermined film thickness of 8,000 Å is formed finally by applying the manufacturing method of the present invention to plural successively formed 2,000 Å, layers. First, as shown in FIG. 8(a), Al interconnections 3a to 3c are formed after forming a $SiO_2$ film 2 on a Si substrate (1) by thermal oxidation.

Then, the wafer is introduced into the load/unload chamber 2 of the apparatus for manufacturing a semiconductor shown in FIG. 2 by means of the robot 24 such as shown in FIG. 1(b). Then, after the wafer holder 25 is moved with the wafer 1 held thereon and carried into the CVD reaction chamber 22a of one processing station, a first CVD $SiO_2$ film 5 having a film thickness of approximately 2,000 Å is formed covering the Al interconnections 3a to 3c in a manner similar to the fifth embodiment by mixed gas of TEOS/ozone. In succession, the wafer holder 25 is moved so as to carry the wafer into the UV processing chamber 23a, and processing by irradiation with ultraviolet rays is performed. Since the formed first CVD SiO₂ film 5 has a sufficiently thin film thickness at this time, the film quality is improved extending over the total film thickness by processing by irradiation with ultraviolet rays (FIG. 8(a)).

Next, after the wafer holder 25 is moved so as to carry the wafer 1 into the CVD reaction system 22b of another processing station, a second CVD SiO₂ film 6 having a film thickness of approximately 2,000 Å is formed on the first CVD SiO₂ film 5 in a manner similar to the fifth embodiment. In succession, the wafer holder 25 is moved so as to carry the wafer 1 into the UV processing chamber 23b, and processing by irradiation with ultraviolet rays is performed. Since the second CVD SiO₂ film 6 also has a sufficiently thin film thickness at this time, the film quality is reformed extending over the entire film thickness in a manner similar to the first CVD SiO₂ film 5.

Figure 8A:
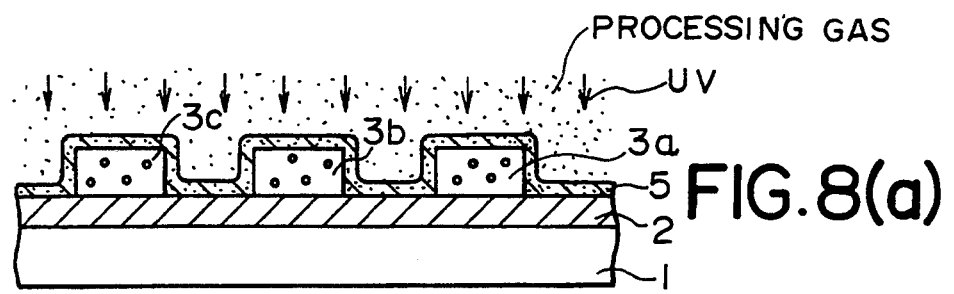
FIGS. 8(a), 8(b), 8(c) and 8(d) are sectional views explaining a seventh embodiment of a method for manufacturing a semiconductor device of the present invention.
Figure 8B:
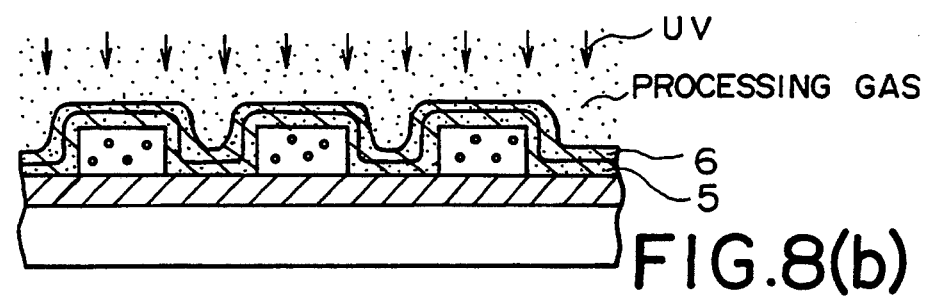
Figure 8C:
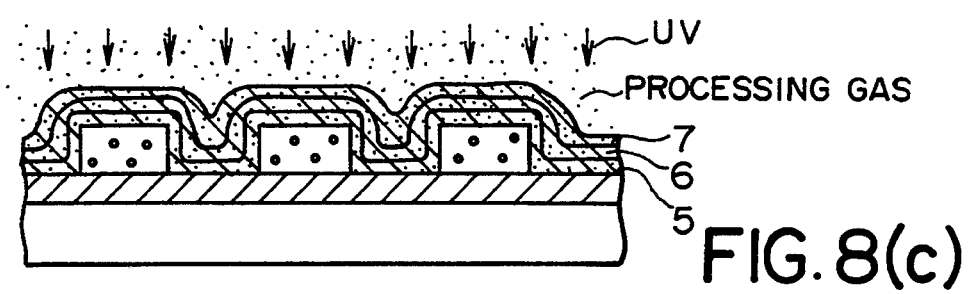
Figure 8D:
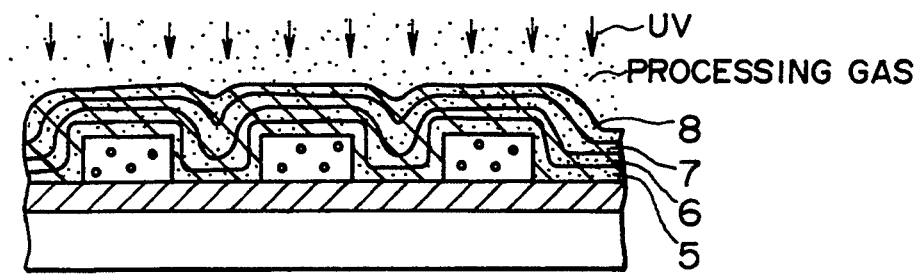

Then, the wafer holder 25 is moved, and a third CVD SiO₂ film 7 having a film thickness of approximately 2,000 Å, irradiated with ultraviolet rays in a manner similar to the fifth embodiment, is formed on the second CVD SiO₂ film 6 at one processing station (22b and 23b) which has formed a film shown in FIG. 8(a) on the wafer 1. In succession, the wafer holder 25 is moved, and a fourth CVD SiO₂ film 8 having a film thickness of approximately 2,000 Å processed by ultraviolet rays is formed similarly to the above at another processing station (22b and 23b) (FIG. 8(d)). Since both the third CVD SiO₂ film 7 and the fourth CVD SiO₂ film 8 have a sufficiently thin film thickness at this time, the film quality is reformed extending over the entire film thickness. As described above, according to the seventh embodiment, a predetermined film thickness of 8,000 Å is formed finally by applying the manufacturing method of the present invention to each sufficiently thin film (thickness of 2,000 Å). Thus, it is possible to further improve the film quality of the CVD SiO₂ films 5 to 8 as a whole as compared with the fifth embodiment.

While the processing is performed by using the apparatus for manufacturing a semiconductor shown in FIG. 2 in the seventh embodiment, it is also possible to form the CVD SiO₂ film in four layers using the apparatus for manufacturing a semiconductor shown in FIGS. 1(a) and (b). In this case, the wafer is recycled four times between the CVD reaction chamber 22 and the UV processing chamber 23. Furthermore, it is possible to further improve mass productivity by using the apparatus for manufacturing a semiconductor shown in FIG. 3.

(8) The eighth embodiment

FIGS. 9(a) to (d) are sectional views explaining a method for forming a capacitor insulating film composed of a Ta₂O₅ film in an eighth embodiment of the present invention. The apparatus of the first embodiment shown in FIGS. 1(a) and (b), in which the reaction gas supply source shown in FIG. 6 is connected to the gas shower of the CVD reaction chamber, is used as will be described hereunder.

Figure 9A:
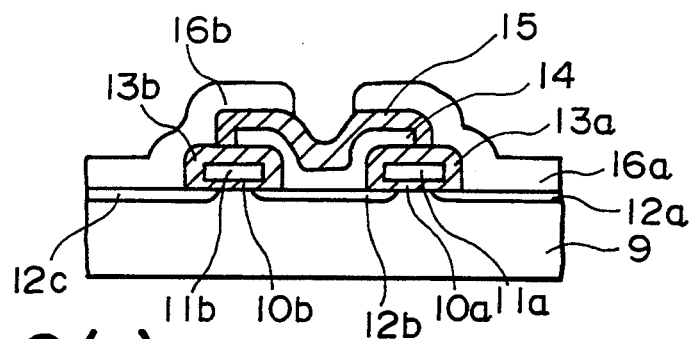
FIGS. 9(a), 9(b), 9(c) and 9(d) are sectional views explaining an eighth embodiment of a method for manufacturing a semiconductor device of the present invention with reference to an example applied to forming a capacitor insulating film of a DRAM.
Figure 9B:
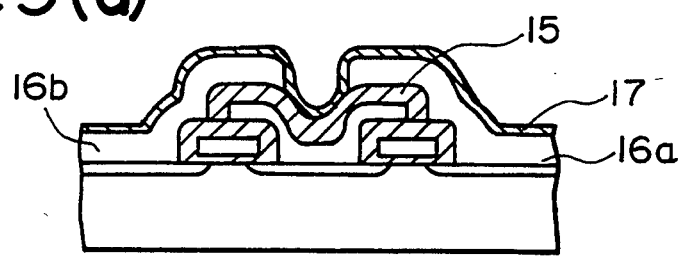
Figure 9C:
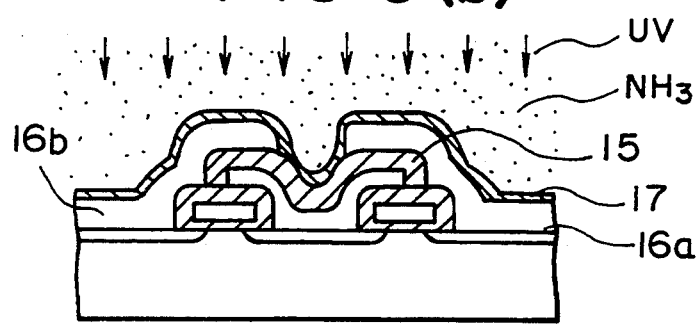

FIG. 9(a) is a sectional view of a DRAM before a capacitor insulating film is formed. A reference numeral 9 in the figure represents a Si substrate (wafer), 10a and 10b represent gate insulating films formed on the Si substrate 9, 11a and 11b represent gate electrodes (word lines) formed on the gate insulating films 10a and 10b, and 12a/12b and 12b/12c represent S/D regions provided on both sides of the gate electrodes 11a and 11b where the S/D region 12b is formed in common. Further, 13a and 13b represent insulating films for covering the gate electrodes 11a and 11b, 14 represents a bit line connected to the common S/D region 12b, 15 represents an insulating film for covering the bit line 14, and 16a and 16b represent storage nodes composed of polysilicon films.

Such a body is introduced into the load/unload chamber 21 of the apparatus shown in FIG. 1(a) by means of the robot 24 such as shown in FIG. 1(b). Then, the wafer holder 25 is moved with the wafer 9 held thereon and carried into the CVD reaction chamber 22. Thereafter, the wafer 9 is heated to a temperature of approximately 350° C.

Next, when valves 40b and 40c of the reaction gas supply source shown in FIG. 6 are opened so that oxygen gas is passed through an ozonizer 43, and converted into ozone gas and fed into the gas piping 39a, valves 40e and 40d are opened at the same time so that nitrogen gas 35 is bubbled through the Ta(OC₂H₅)₅ solution heated to a temperature of approximately 65° C., and nitrogen gas containing Ta(OC₂H₅)₅ is passed through the gas piping 39a and the gas dispersing head 26 onto the wafer 9, the mixed gases react with each other on the surface of the SiO₂ film 16, and an amorphous Ta₂O₅ film 17 starts to form at a growth rate of approximately 1,200 Å/min. Then, when this state is held for several tens of seconds, the amorphous Ta₂O₅ film (capacitor insulating film) 17 having a film thickness of approximately 600 Å is formed on storage nodes 16a and 16b and the SiO₂ film 15 (FIG. 9(b)).

Then, after the supply of the reaction gas is stopped by closing the valves 40b to 40e, the wafer holder 25 shown in FIG. 1(b) is moved to the UV processing chamber 23 shown in FIG. 1(a). Then, the temperature of the wafer 9 is raised to approximately 400° C., and the mercury lamps 30 are turned on at the same time. Furthermore, ozone gas is introduced through the gas inlet port 32 of the mercury lamp holder 31 and the surface of the wafer 9 is contacted with the ozone gas. This state is held for a predetermined period of time.

At this time, impurities such as —OH and —H bonded with H₂O and Ta on the surface of the Ta₂O₅ film 17 and inside the Ta₂O₅ film are discharged from the Ta₂O₅ film 17 by the energy of ultraviolet rays or by interaction between irradiation with ultraviolet rays and heating. Further, since the surface of the wafer 9 has been flushed with ozone gas or oxygen gas, the dangling bonds of Ta on the surface are inundated with oxygen atoms by the operation of one of ozone and oxygen activated by irradiation with ultraviolet rays, and the Ta₂O₅ film 17 is further densified. Thus, reformation of the Ta₂O₅ film 17 formed at a low temperature is completed (FIG. 9(c)).

Next, the mercury lamps 30 are turned off, and the wafer holder 25 is moved so as to pass through the CVD reaction chamber 22 and is sent to the load/unload chamber 21. Furthermore, the wafer 9 is delivered to the robot 24 by operation reverse to that when the wafer 9 is carried in, and the wafer 9 is taken out of the apparatus 5 by means of the robot 24.

Figure 9D:
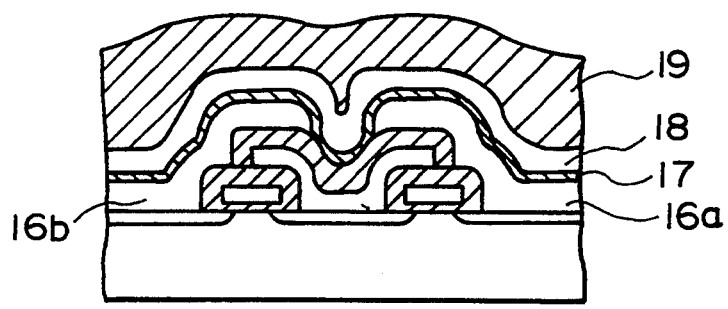

When a cell plate 18 composed of a polysilicon film and a cover insulating film 19 are formed successively on the Ta₂O₅ film 17 thereafter through normal processes, a DRAM is completed (FIG. 9(d)).

As described above, according to the method for forming an interlevel insulating film in the eighth embodiment of the present invention, the Ta$_2$O$_5$ film 17 is formed at a low temperature. Thus, it is possible to reduce the stress of the Ta$_2$O$_5$ film 17 applied to surrounding insulating films. Moreover, since processing by irradiation with ultraviolet rays is performed, H$_2$O and —OH and —H bonded with Ta are removed from the Ta$_2$O$_5$ film 17, which contains much H$_2$O and bonds such as Ta—OH and Ta—H due to formation at a low temperature, thus making it possible to form a fine film. Furthermore, since ultraviolet rays are emitted in an ozone gas or oxygen gas atmosphere, the dangling bonds of Ta are inundated with oxygen atoms by the operation of ozone or oxygen activated by irradiation with ultraviolet rays as shown in FIG. 11(b), and the Ta$_2$O$_5$ film 17 is further densified.

Accordingly, it is possible to prevent lowering of dielectric breakdown strength of the Ta$_2$O$_5$ film 17 itself and lowering of reliability such as increase of leakage current. While the Ta$_2$O$_5$ film 17 is formed under atmospheric pressure in the eighth embodiment, it is also possible to use under reduced pressure. Further, ozone gas or oxygen gas is used as processing gas, but ammonia gas may also be used.

(9) The ninth embodiment

FIG. 10 is a sectional view explaining a method of forming a capacitor insulating film consisting of a triple layer insulating film of a lower CVD SiO$_2$ film/a Ta$_2$O$_5$ film/an upper CVD SiO$_2$ film, in a ninth embodiment of the present invention. Use of the apparatus shown in FIG. 2 and FIG. 6 will be explained hereunder.

First, the wafer 9, before forming a capacitor insulating film described with reference to FIG. 9(a), is introduced into the load/unload chamber 21 of the apparatus shown in FIG. 2 by means of the robot 24 such as shown in FIG. 1(b). Then, after moving the wafer holder 25 with the wafer 9 held thereon and carrying it into the CVD reaction chamber 22a of one processing station, the wafer 9 is heated to a temperature of approximately 400° C. by means of a heater provided inside the wafer holder 25.

Next, nitrogen gas is fed into the TEOS solution, heated by a heater 42b to a temperature of 65° C., by opening the valve 40g and bubbled therethrough. Then, nitrogen gas containing TEOS as reaction gas is fed to the gas piping 39a and ozone gas generated by the ozonizer 43 is also fed to the gas piping 39a wherein the gases become mixed. This mixed gas is passed through the gas piping 39a and the gas dispersing head 26 and onto the wafer 9. With this, well-known TEOS-ozone reaction a lower CVD SiO$_2$ film 20a is formed on the wafer 9 (FIG. 10).

Next, the valves 40f and 40g shown in FIG. 6 are closed, and the wafer 9 is sent to the UV processing chamber 23a. Then, ozone gas is introduced so as to flush the surface of the wafer with ozone gas, and ultraviolet rays are emitted for a predetermined period of time while maintaining the wafer temperature at 400° C.

Next, after suspending the supply of ozone gas, the wafer 9 is sent to the CVD processing chamber 22b.

In succession, the temperature of the wafer 9 is lowered to approximately 350° C., and the valves 40d and 40e are opened at the same time so as to mix nitrogen gas containing Ta(OC$_2$H$_5$)$_5$ with ozone gas in a manner similar to the seventh embodiment. When this mixed gas is passed through the gas piping 39a and the gas dispersing head 26 and introduced onto the wafer 9, the mixed gases react with each other on the surface of the SiO$_2$ film 20a, and an amorphous Ta$_2$O$_5$ film 20b starts to form at a growth rate of approximately 1,200 Å/min. Then, when this state is held for several tens of seconds, the amorphous Ta$_2$O$_5$ film 20b having a film thickness of approximately 600 Å is formed on the lower CVD SiO$_2$ film 20a (FIG. 10).

Then, the valves 40d and 40e are closed, and the wafer 9 is sent to the UV processing chamber 23. Then, ozone gas is introduced so as to flush the surface of the wafer 9 with ozone gas, and ultraviolet rays are emitted for a predetermined period of time while maintaining the wafer temperature at 400° C.

Next, after the supply of ozone gas is suspended, the wafer is sent to the CVD processing chamber 22a again. Then, the valves 40f and 40g are opened, and the wafer 9 is heated to a temperature of approximately 400° C. Mixed gas of organic silane/ozone is passed through the gas piping 39a and the gas dispersing head 26 onto the wafer 9, to thereby form an upper CVD SiO$_2$ film 20c on the Ta$_2$O$_5$ film 20b. A triple layer insulating film (capacitor insulating film) 20 composed of lower CVD SiO$_2$ film 20a/Ta$_2$O$_5$ film 20b/upper CVD SiO$_2$ film 20c is formed (FIG. 10).

As described above, according to the manufacturing method in the ninth embodiment, notwithstanding that lower CVD SiO$_2$ film 20a/Ta$_2$O$_5$ film 20b/upper CVD SiO$_2$ film 20c are formed at a low temperature, respectively, irradiation with ultraviolet rays is applied to all of them. Hence, H$_2$O and the like are moved, and a triple layer insulating film 20 of still better film quality can be formed. In particular, ultraviolet rays are emitted in an ozone gas or oxygen gas atmosphere. Therefore, the dangling bonds of Ta and Si are inundated with oxygen atoms by the operation of ozone or oxygen activated by irradiation with ultraviolet rays, and the lower CVD SiO$_2$ film 20a/the Ta$_2$O$_5$ film 20b/the upper CVD SiO$_2$ film 20c are further densified. Further, it is possible to easily form a triple layer insulating film 20 of still better film quality by switching the reaction gas.

While the lower CVD SiO$_2$ film 20a/the Ta$_2$O$_5$ film 20b/the upper CVD SiO$_2$ film 20c are formed under atmospheric pressure in the ninth embodiment, it is also possible to use reduced pressure. Further, while a triple layer insulating film 20 has been described a double layer insulating film composed of a SiO$_2$ film described a double layer insulating film composed of a SiO$_2$ film and a Ta$_2$O$_5$ film and other multilayer insulating films can be formed. Furthermore, while use of the apparatus for manufacturing a semiconductor shown in FIG. 2 has been described, the insulating film can also be formed by using the apparatus shown in FIGS. 1(a) and (b) and FIG. 3. Further, while ozone gas or oxygen gas was used as processing gas, ammonia gas may also be used.

What is claimed is:

1. A method for forming an insulating film comprising the steps of:
   a) forming an insulating film on a substrate by chemical vapor deposition, said insulating film being formed of a material selected from the group consisting of SiO$_2$, PSG, BSG and BPSG;
   b) heating said substrate to an elevated temperature of 200°–240° C.;
   (c) thereafter irradiating said insulating film with ultraviolet rays while maintaining said substrate at said elevated temperature to densify said film over its entire thickness.

2. A method for forming an insulating film according to claim 1, wherein said film on said substrate is SiO$_2$ formed by CVD from a reaction gas which is a gas mixture of mono-silane (SiH$_4$) and oxygen (O$_2$).

3. A method for forming an insulating film according to claim 1, wherein the film on said substrate is one of PSG, BSG and BPSG formed from a reaction gas which is a gas mixture of mono-silane (SiH$_4$), oxygen (O$_2$) and a gas containing at least one of phosphorous (P) and boron (B).

4. A method for forming an insulating film according to claim 1, wherein said film on said substrate is SiO$_2$ formed by CVD from a reaction gas which is a gas mixture containing an organic silane and ozone (O$_3$).

5. A method for forming an insulating film according to claim 4, wherein said organic silane is an alkoxy-containing compound of silicon, siloxane or alkyl silane.

6. A method for forming an insulating film according to claim 1, wherein the film on said substrate is any of PSG, BSG and BPSG formed from a reaction gas which is a gas mixture of an organic silane, ozone (O$_3$) and a gas containing at least one of phosphorous (P) and boron (B).

7. A method for forming an insulating film according to claim 6, wherein said organic silane is an alkoxy-containing compound of silicon, a siloxane or an alkyl silane.

8. A method for forming an insulating film according to claim 1, wherein the insulating film is provided with a greater thickness than first deposited thickness by repeating steps (a), (b), (c) and (d) a plurality of times.

9. A method for forming an insulating film comprising the steps of:
   a) forming an insulating film on a substrate by chemical vapor deposition, said insulating film being formed of a material selected from the group consisting of SiO$_2$, PSG, BSG And BPSG;
   b) heating said substrate to an elevated temperature of 200°–450° C.;
   c) contacting said film with ammonia gas; and
   d) thereafter irradiating said insulating film with ultraviolet rays while maintaining said substrate at said elevated temperature and said film in contact with said ammonia gas, to densify said film over its entire thickness.

10. A method for forming an insulating film according to claim 9, wherein said elevated temperature of said substrate is 350° C. to 450° C. while said insulating film is irradiated with ultraviolet rays.

11. A method for forming an insulating film according to claim 9, wherein said film on said substrate is SiO$_2$ formed by CVD from a reaction gas which is a gas mixture of mono-silane (SiH$_4$) and oxygen (O$_2$).

12. A method for forming an insulating film according claim 9 wherein the film on said substrate is one of BSG and BPSG formed from a reaction gas which is a gas mixture of mono-silane (SiH$_4$), oxygen (O$_2$) and a gas containing at least one of phosphorous (P) and boron (B).

13. A method for forming an insulating film according to claim 9 wherein said film on said substrate is SiO$_2$ formed by CVD from a reaction gas which is a gas mixture containing an organic silane and ozone (O$_3$).

14. A method for forming an insulating film according to claim 12, wherein said organic silane is an alkoxy-containing compound of silicon, a siloxane, or an alkyl silane.

15. A method for forming an insulating film according to claim 9, wherein the film on said substrate is one of PSG, BSG and BPSG formed from a reaction gas which is a gas mixture containing an organic silane and ozone (O$_3$), and a gas containing at least one of phosphorous (P) and boron (B).

16. A method for forming an insulating film according to claim 15, wherein said organic silane is an alkoxy-containing compound of silicon, a siloxane or an alkyl silane.

17. A method for forming an insulating film according to claim 9, wherein the insulating film is provided with a greater thickness than first deposited thickness by repeating steps (a), (b), (c) and (d) a plurality of times.

18. A method for forming an insulating film according to claim 1 wherein said elevated temperature is 300°14 450° C.

19. A method for forming an insulating film according to claim 9 wherein said elevated temperature is 300°–450° C.

* * * * *

UNITED STATES PATENT AND TRADEMARK OFFICE
CERTIFICATE OF CORRECTION

PATENT NO. : 5,387,546
DATED : February 7, 1995
INVENTOR(S) : MAEDA et al

It is certified that error appears in the above-indentified patent and that said Letters Patent is hereby corrected as shown below:

Col. 5, line 5, "(nm- )" should read --$(nm^{-1})$--.

Col. 18, line 62, "240°" should read --450°--.

Col. 19, line 30, delete "(b)," and insert --(b) and--;

line 30, delete "and (d)".

Col. 20, line 40, delete "300° 14 450°" and insert "300° - 450°".

Signed and Sealed this

Thirty-first Day of October 1995

Attest:

BRUCE LEHMAN

Attesting Officer

Commissioner of Patents and Trademarks